United States Patent [19]

Dahringer

[11] Patent Number: 5,548,087
[45] Date of Patent: Aug. 20, 1996

[54] MOLDED PLASTIC PACKAGING OF ELECTRONIC DEVICES

[75] Inventor: Donald W. Dahringer, Glen Ridge, N.J.

[73] Assignee: AT&T Corp., Murray Hill, N.J.

[21] Appl. No.: 59,044

[22] Filed: May 7, 1993

[51] Int. Cl.6 .................................................. H01L 23/02
[52] U.S. Cl. .......................................... 174/52.4; 257/692
[58] Field of Search ....................... 174/52.4, 52.1–52.3; 257/676, 666, 678, 690, 692, 696, 701, 702, 787; 361/813; 29/834, 835, 838, 841, 855

[56] References Cited

PUBLICATIONS

L. T. Manziano, "Plastic Packaging of Microelectronic Devices", Van Nostrand–Reinhold, N.Y. 1990, pp. 84–95.
L. T. Manziano, "Plastic Packaging of Microelectronic Devices", Van Nostrand–Reinhold, N.Y. 1990, p. 366.
L. T. Manziano, "Plastic Packaging of Microelectronic Devices", Van Nostrand–Reinhold, N.Y. 1990, pp. 95–97.
L. T. Manziano, "Plastic Packaging of Microelectronic Devices", Van Nostrand–Reinhold, N.Y. 1990, pp. 361–363.
Patent No. Patent Abstracts of Japan, vol. 015, No. 110 (E–1046) 15 Mar. 1991 & JP–A–03 003 354 (NEC Yamagata Ltd.), issued in Japan on 9 Jan. 1991 to Oba Seiichi.
Patent No. Patent Abstracts of Japan, vol. 016, No. 429 (E–1261) 8 Sep. 1992 & JP–A–04 148 558 (Fujitsu Ltd.), issued in Japan on 21 May 1992 to Suzuki Toshiaki.
Patent No. Patent Abstracts of Japan, vol. 012, No. 221 (E–625) 23 Jun. 1988 & JP–A–63 015 453 (Fujitsu Ltd.), issued in Japan on 22 Jan. 1988 to Ishihara Michio.
Patent No. Patent Abstracts of Japan, vol. 010, No. 141 (E–406) 24 May 1986 & JP–A–61 004 261 (Nippon Denki KK), issued in Japan on 10 Jan. 1986 to Satou Mamoru.
Patent No. Patent Abstracts of Japan, vol. 016, No. 332 (E–1236) 20 Jul. 1992 & JP–A–04 098 861 (NEC Kyushu Ltd.), issued in Japan on31 Mar. 1992 to Tsuji Yukihiro.
Patent No. WO–A–92 03845 (LSI Logic Europe PLC), issued on 5 Mar. 1992 to Trevor Gainey.
Patent No. GB–A–2 186 745 (Shin–Etsu Polymer Co. Ltd.), issued in Great Britain on 19 Aug. 1987 to Toshiyuki Kawaguchi, Hideki Suzuki.

*Primary Examiner*—Kristine L. Kincaid
*Assistant Examiner*—Christopher Horgan
*Attorney, Agent, or Firm*—Oleg E. Alber; Bruce S. Schneider

[57] ABSTRACT

Described is a plastic encapsulated electronic device having an integrated circuit unit, a lead frame and a plastic material encapsulating the IC unit and portions of the leads into a sealed package. Each of the leads includes an inner portion adjacent the IC unit, an outer portion laying in a different plane than the inner portion, and a central portion interconnecting the inner and the outer portions. The plastic enclosure is so formed that the outer portion of each lead, except for its lowermost flat surface and a short outermost section, is embedded in the plastic material. The bottom surface of the plastic enclosure is substantially coplanar with the lowermost flat surface of each lead. The short outermost portion of the outer lead portion extends beyond the plastic material for testing purposes. This arrangement provides for a robust encapsulation of the leads avoiding the prior problems of the prior art. Additionally, this device is especially useful for attaching the device to an interconnecting board by the use of conductive adhesives.

7 Claims, 3 Drawing Sheets

MOLDED PLASTIC PACKAGING OF ELECTRONIC DEVICES

TECHNICAL FIELD

This invention concerns plastic encapsulated electronic devices, such as integrated circuits and hybrid integrated circuits.

BACKGROUND OF THE INVENTION

Electronic devices, such as integrated circuit devices having an integrated circuit unit and a lead frame which are sealed within a protective enclosure, find wide use in products including consumer electronics, household appliances, computers, automobiles, robotics, telecommunications, and military equipment. The IC unit may be an integrated circuit on a chip or it may be a module, a hybrid integrated circuit (HIC) having one or more chips, other electronic components and circuitry on a plastic or ceramic support base. The IC devices are sealed within an enclosure such as a metal cap, ceramic shell, or plastic molding in order to protect the device from the environment, including mechanical and chemical damage. Molded plastic packaging of the electronic devices plays a major role in the microelectronics industry. Plastic packages are less expensive than other types of packaging options, such as ceramic and/or metal packaging, and provide performance and reliability that make them acceptable in a major fraction of worldwide electronic device packaging. A means to electrically interconnect the IC device to circuitry external of the package conventionally types the form of a lead frame. The lead frame is formed from an electrically conductive material, such as copper alloy or an iron-nickel alloy, by stamping or etching a metal blank into a plurality of lead fingers defining a central area in which the IC unit is mounted. The central area may include a paddle on which the IC unit is mounted, or may include an aperture in which the electronic device is mounted. Contact pads on an IC unit are typically connected to the leads of the lead frame by means of wires or tapes. Alternatively, ends of the leads may be soldered or conductive adhesive may be used to contact the pads.

After the IC unit is electrically connected to the leads of the lead frame, the assembly is encapsulated in a plastic molding compound with end portions of leads projecting beyond the edge of the encapsulant. The ends of the leads are then formed into different configurations. In FIGS. 4, 5 and 6 are shown typical prior art devices 40, 50 and 60, respectively, with leads having so-called "gull wing", "J" or "butt"-configuration, respectively, for surface mounting the devices onto circuit boards.

The packages may be dual-in-line package (DIP) and quad (or chip carrier) package. In the DIP, leads extend in straight lines from two edges of the formed body. When the number of leads becomes high, such as exceeding 48, a DIP configuration becomes impractical and wasteful of circuit board area. Quads, packages with leads on all four sides, are preferable for these higher lead count devices.

Manufacturing (e.g., encapsulation and lead shaping) and assembly (e.g., handling, placement and soldering) operations can distort the leads of the encapsulated devices resulting in an improper connection of the leads to contacts or pads upon the circuit interconnection boards. Conventionally, electrical connection and bonding of the leads to the contacts on the interconnection board is accomplished by soldering. However, the shape of the end portions of leads of such prior art shaped leads as are shown in FIGS. 4, 5 and 6, presents a small contacting area for establishing an electrical contact between the leads and the contacts on the interconnection board and will depend, primarily, on the solder connection between the leads and the conductors. A distorted configuration of at least some of the leads e.g., due to manufacturing and handling operations, could result in misalignment of contacting areas of the leads with respect to the contacts on the interconnection board, which, in turn, could result in a faulty electrical and mechanical connection. These problems are expected to be aggravated by industry trends toward thinner leads (e.g., 5–10 mil), closer spacing (pitch) between the leads (e.g., 5–10 mil) and smaller footprint combined with greater size of the devices, to accommodate higher number of leads on the device perimeter. Thus, there is a need for a packaging design which would eliminate or at least reduce these problems.

SUMMARY OF THE INVENTION

The present invention is a plastic encapsulated electronic device having an integrated circuit unit, a lead frame and a plastic material encapsulating the IC unit and portions of the leads into a sealed package. Each of the leads includes an inner portion adjacent the IC unit, an outer portion laying in a different plane than the inner portion, and a central portion interconnecting the inner and the outer portions. The plastic enclosure is so formed that the outer portion of each lead, except for its lowermost flat surface and a short outermost section, is embedded in the plastic material. The bottom surface of the plastic enclosure is substantially coplanar with the lowermost flat surface of each lead. The short outermost portion of the outer lead portion extends beyond the plastic material for testing purposes. This arrangement provides for a robust encapsulation of the leads avoiding the prior problems of the prior art. Additionally, this device is especially useful for attaching the device to an interconnecting board by means of conductive adhesives.

DETAILED DESCRIPTION

Figure 1:
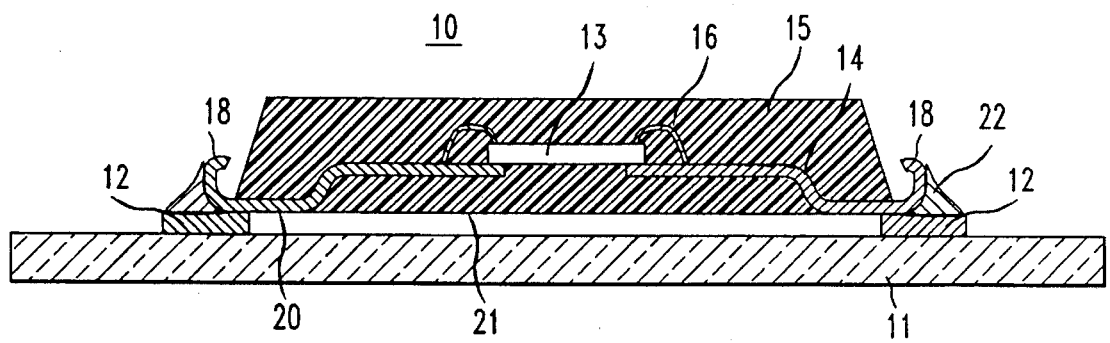
FIG. 1 is a cross-sectional schematic representation of a plastic encapsulated IC device with leads portions of which have essentially co-planar lead surfaces for mating with and being secured to conductors on an interconnection board by solder.
Figure 2:
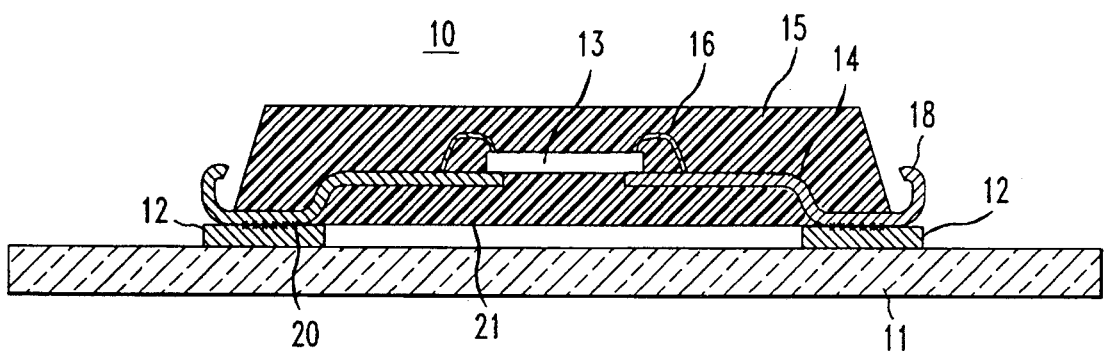
FIG. 2 is a cross-sectional schematic representation of a plastic encapsulated IC device with leads portions of which have essentially co-planar lead surfaces for mating with and being secured to conductors on an interconnection board by means of a conductive adhesive.
Figure 3:
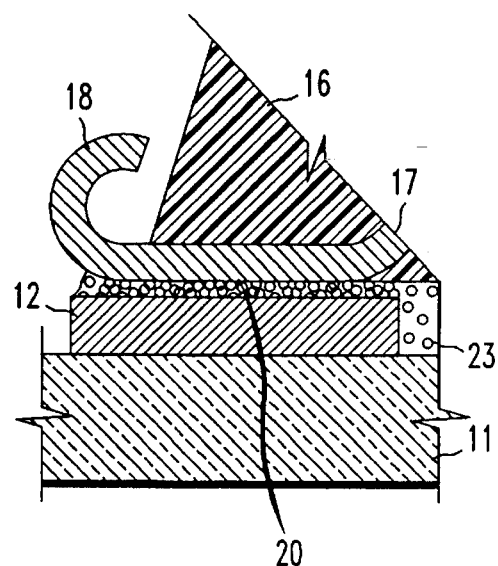
FIG. 3 is an enlarged cross-sectional schematic representation of a portion of the device shown in FIG. 2.
Figure 4:
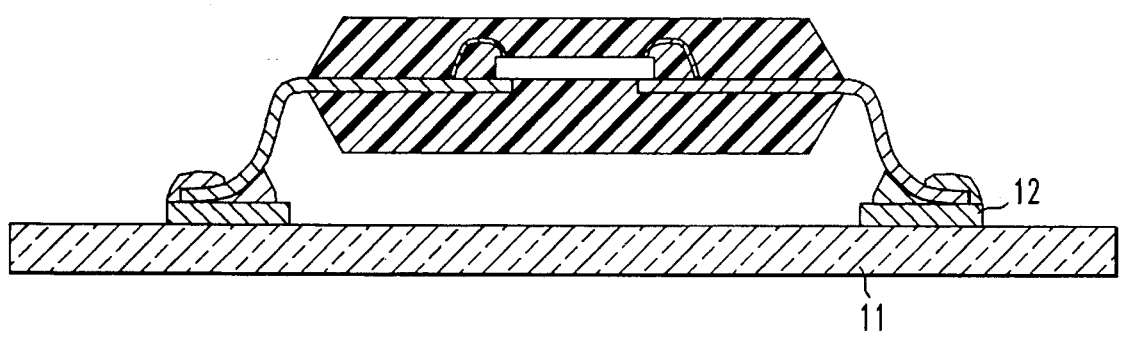
FIG. 4 is a cross-sectional schematic representation of a prior art plastic encapsulated IC device having gull wing-shaped leads.
Figure 5:
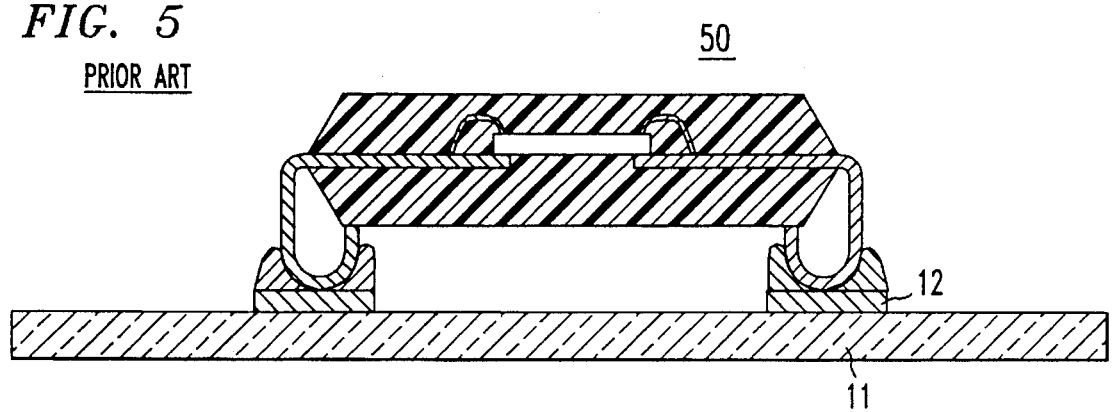
FIG. 5 is a cross-sectional schematic representation of a prior art plastic encapsulated IC device having J-shaped leads.
Figure 6:
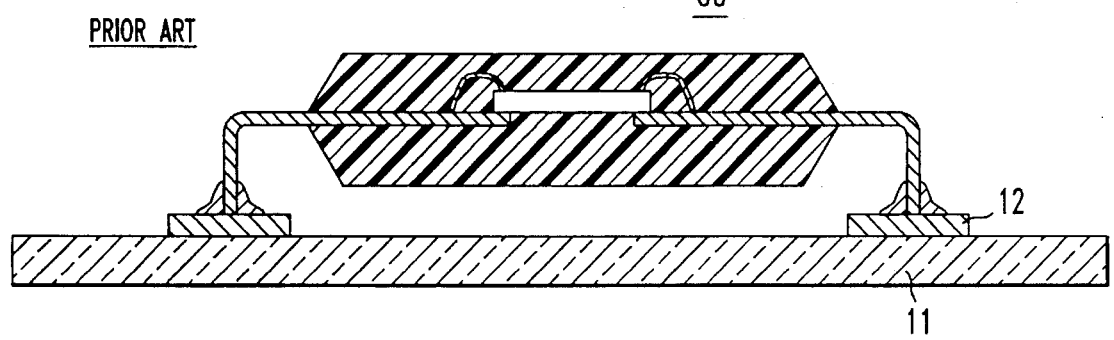
FIG. 6 is a cross-sectional schematic representation of a plastic prior art encapsulated IC device having butt-shaped leads.

A schematic representation, in cross-section, of an embodiment of an encapsulated IC device, 10, according to the invention, is shown in FIGS. 1, 2 and 3 of the drawings.

For purposes of illustration, dimensions of the encapsulated IC device are not drawn to scale. Encapsulated IC device 10 is surface-mounted on a support, such as an interconnection board, 11, e.g., a printed wiring board, having contacts or pads, 12.

IC device 10 includes an IC unit, 13, and a lead frame with leads, 14, encapsulated in an organic encapsulating material, 15. Contacts or pads (not shown) on the IC unit are electrically connected via wires 16 to leads 14. Leads 14 form a part of a lead frame as is well known in the art. In the illustration example, ends of the leads support the IC unit. In some other variants of the encapsulated IC device, the leads may abut the IC unit, may be in a spaced arrangement with the IC unit, or may be in contact with an upper surface of the IC unit. In the latter arrangement, ends of the leads may be in contact with pads on the upper surface of the IC unit. Alternatively, the IC unit may be supported by a die paddle (not shown) which forms a part of the lead frame.

Leads 14 are formed typically prior to the assembly with the IC unit so that an end portion of each lead 14 is formed into a planar end section 17. The preformed lead frame and IC unit assembly is encapsulated in a plastic material, 15. There are several different types of molding plastic materials that can be used for the packaging; however, epoxy molding compounds are the most commercially important materials. For example, see Louis T. Manziano, "Plastic Packaging of Microelectronic Devices", Van Nostrand-Reinhold, New York, 1990, pp. 84–95. The plastic material is molded in the shape of a rectangular or a square package, depending on the type of the packaging, that is whether it is a DIP or a quad package, respectively. In either case, the package is in the form of a trapezoid in cross-section. In the case of the DIP package the trapezoidal cross-section is across the short side of the rectangle, and in the case of the quad package, the trapezoidal cross-section is at right angles each to another. Rectangular cross-section of the package is possible; however it may present difficulties in removing the package from the mold. The plastic material encapsulates the IC unit and most of the lead frame with the exception of lower outer surface, 20, of planar end section 17 of each lead, and of outermost end section 18 of the lead. Lower outer surface 20 of the planar section of each lead, and the bottom surface 21 of the broad base of the trapezoidally shaped encapsulation 15 lie in approximately the same plane. After the encapsulation, outer surface 20 of planar sections 17 of the leads is exposed through the bottom surface of encapsulant 15, presenting a planar metallic surface suitable for joining to contacts 12 on the printed circuit board. In those instances where outer surface 20 may become covered during the encapsulation with an excess of plastic material, which sometimes is called "flash", the excess plastic material is removed, for example by lapping, so as to expose metal surface 20 of the planar section. After the encapsulation with the organic material and trimming of the frame, short outermost end section 18 of the lead is bent upward or formed from the planar end section for testing or other purposes.

The encapsulated IC device 10 is then surface-mounted on interconnection board 11 such as the printed circuit board either by means of solder or by a conductive polymer interconnect material. As is seen in FIG. 1, the planar surface of each lead mates with the flat surface of each contact on the board to establish an excellent bond by means of a thin interface layer of solder. Solder fillets 22 between outermost end sections 18 of the leads and contacts 12 further anchor the leads to contacts 12 providing robust soldered joints.

The lead configuration is especially suitable for the use of conductive adhesives to form an electric connection between the planar surfaces of the leads and the contacts on the interconnection board. Conductive adhesives are organic materials containing electrically conductive particulate material. Epoxies are the most commonly used matrix materials, and silver, nickel, or silver-coated glass particles are used as the most common filler materials. Conductive adhesives are usually liquids or pastes that are used in place of solder to attach the leads of the device to the circuit board. They are applied to contacts or pads on the circuit board either through a screen or by stamp printing. For example, see Louis T. Manziano, "Plastic Packaging of Microelectronic Devices," Van Nostrand-Reinhold, New York, 1990, p. 366.

Conductive adhesives may be isotropically or anisotropically conductive. The anisotropic conductive adhesives, sometimes called AdCons, seem to be the most suitable for bonding devices having a very small pitch (distance between the leads). In other applications, isotropic adhesives may be used as well. Anisotropically conductive materials are conductive in only one direction, typically the z-axis perpendicular to the surface of the board, and are insulating in the other directions. Anisotropic materials are attractive for high density interconnections where conventional bonding such as by means of solder or wires may be inadequate. The anisotropy derives from achieving the proper conductive filler concentration such that sufficient particles will bridge the gap between metal surface 20 and contact 12; however, the concentration of particles is low enough so that the particles do not touch each other in x-y plane, thus providing isolation over distances smaller than the bond pad spacing or lead spacing.

After AdCon 23 is placed over contacts 12 on the interconnection board, the molded device is placed on the board so that planar lead sections 17 coincide with the mating contacts. Moderate pressure is applied to the encapsulated device to squeeze the AdCon to a thickness where conductive particles at an overlapping area establish an electrically conductive contact between the opposing surfaces of the leads and the contacts. Application of heat expedites the curing of the adhesive.

The nature of the AdCon permits the use of lead frames with very small pitch, e.g., 5–10 mil. Conductive particles in the AdCon are normally dispersed in the adhesive and their size is selected so that any possibility of establishing an accidental electrical contact between the leads is avoided. However, a danger of such an electrical contact between the leads when using soldering techniques increases with the decrease in the spacing (the pitch) between the leads. Please note that when using the AdCon, the mating leads and contacts overlap over a greater extent (FIG. 2) than when solder is used as a bonding conductive material. This is so that sufficient numbers of conductive particles can be placed between the mating surface, while in the case of solder, only a minimal thickness of solder is present over a minimal mating surface, sufficient to establish an electrical contact while avoiding possible side effects of the solder on the mating contacting surfaces.

Additional advantages and modifications will readily occur to those skilled in the art. Therefore, the invention in its broader aspects is not limited to specific details, representative devices, and illustrated examples shown and described. Accordingly, various modifications may be made without departing from the spirit or scope of the general inventive concept as defined by the appended claims and their equivalents.

I claim:

1. A plastic molded circuit package, which comprises:

an integrated circuit (IC) unit, a plurality of leads projecting away from the IC unit, and plastic material encapsulating the IC unit and portions of the leads and forming a sealed package, wherein each of said leads has an inner section immediately adjacent to and projecting away from the IC unit, a flat outer section for electrical connection to outside contacts, said outer section laying in a different plane than the inner section, and a central section interconnecting the inner and the outer sections, said inner and central sections being completely enclosed in the plastic material and said flat outer section being embedded in the plastic material such that only an outer conductive surface of each lead is exposed to permit said electrical connection, the outer conductive surface laying in a plane which is essentially coplanar with a bottom surface of the molded package, wherein an outermost end section of each lead forms an extension of the outer section, projects from the plastic material, and is bent away from said plane of the outer section, whereby said outer conductive surface is enabled to form an interconnection between the IC unit and contacts of an interconnect board by means of an interconnect material comprising solder or polymeric adhesive material.

2. The circuit package of claim 1, in which said package is on said interconnection board having contacts thereon, said outer conductive surface of each lead being secured in an electrical connection to one of the contacts on the interconnection board.

3. The circuit package of claim 2, in which said electrical connection is formed by means of an anisotropically conductive adhesive positioned between said outer conductive surface of the leads and the surface of the corresponding contact on said interconnection board.

4. The circuit package of claim 2, in which said electrical connection is formed by means of a solder.

5. The circuit package of claim 1, in which said outermost end section of each lead is useable for testing purposes.

6. The circuit package of claim 1, in which said outermost end section of each lead is anchored to one of the contacts on the interconnection board by means of a fillet of solder.

7. The circuit package of claim 1 in which said plastic material is shaped in the form of a trapezoid in cross-section, the broader base of the trapezoid encompassing said flat outer section of the leads.

* * * * *